US012043134B2

(12) United States Patent
Chow et al.

(10) Patent No.: US 12,043,134 B2
(45) Date of Patent: Jul. 23, 2024

(54) AGGREGATING CAPACITY FOR DEPOT CHARGING

(71) Applicant: BP PULSE FLEET NORTH AMERICA INC., Mountain View, CA (US)

(72) Inventors: Bryan M. Chow, Santa Clara, CA (US); Victor Shao, Mountain View, CA (US)

(73) Assignee: BP PULSE FLEET NORTH AMERICA INC., Mountain View, CA (US)

(*) Notice: Subject to any disclaimer, the term of this patent is extended or adjusted under 35 U.S.C. 154(b) by 0 days.

(21) Appl. No.: 18/155,453

(22) Filed: Jan. 17, 2023

(65) Prior Publication Data
US 2023/0145630 A1 May 11, 2023

Related U.S. Application Data

(63) Continuation of application No. 17/177,498, filed on Feb. 17, 2021, now Pat. No. 11,554,684.

(51) Int. Cl.
*B60L 53/63* (2019.01)
*B60L 53/10* (2019.01)
(Continued)

(52) U.S. Cl.
CPC ............... *B60L 53/63* (2019.02); *B60L 53/11* (2019.02); *B60L 53/53* (2019.02); *B60L 53/64* (2019.02);
(Continued)

(58) Field of Classification Search
CPC .......... B60L 53/63; B60L 53/11; B60L 53/53; B60L 53/64; B60L 53/66; H02J 3/007;
(Continued)

(56) References Cited

U.S. PATENT DOCUMENTS

| 7,693,609 B2 * | 4/2010 | Kressner ................ G06Q 20/40 700/297 |
| 7,949,435 B2 * | 5/2011 | Pollack .................... B60L 53/20 315/80 |

(Continued)

FOREIGN PATENT DOCUMENTS

| CA | 2791017 A1 * | 2/2011 | ............. B60L 1/006 |
| CN | 109463029 A | 3/2019 | |

(Continued)

OTHER PUBLICATIONS

International Search Report and Written Opinion for PCT Application No. PCT/US2022/016655 dated Jun. 29, 2022.

*Primary Examiner* — Brian Ngo
(74) *Attorney, Agent, or Firm* — Dorsey & Whitney LLP

(57) ABSTRACT

Systems and methods are provided for aggregating and assigning power capacity for charging electric vehicles and providing power to other loads. The systems include a DC bus system used to harmonize and combine power drawn from grid connections having different electrical characteristics such as different voltages or phase levels and from other devices such as energy storage systems and generators at the site. Using the systems and methods can help enable utility customer sites to providing electric vehicle charging, especially for multiple electric vehicles, where the sites would otherwise not have sufficient power to do so without significant and expensive service upgrades and modifications.

14 Claims, 6 Drawing Sheets

(51) Int. Cl.
  B60L 53/53 (2019.01)
  B60L 53/64 (2019.01)
  B60L 53/66 (2019.01)
  H02J 3/00 (2006.01)
  H02J 3/38 (2006.01)
  H01J 37/24 (2006.01)

(52) U.S. Cl.
  CPC .............. B60L 53/66 (2019.02); H02J 3/007 (2020.01); H02J 3/38 (2013.01); H01J 37/241 (2013.01); *H02J 2310/00* (2020.01); *H02J 2310/60* (2020.01)

(58) Field of Classification Search
  CPC ......... H02J 3/38; H02J 2310/00; Y02T 90/12; Y02T 90/16
  USPC ................... 320/106, 107, 108, 10, 110, 112
  See application file for complete search history.

(56) References Cited

U.S. PATENT DOCUMENTS

| | | | |
|---|---|---|---|
| 8,019,697 B2* | 9/2011 | Ozog | H02J 7/35 705/400 |
| 8,299,754 B2 | 10/2012 | Hayashigawa et al. | |
| 8,566,046 B2* | 10/2013 | Deaver, Sr. | G01R 31/52 702/58 |
| 8,781,809 B2 | 7/2014 | Bridges | |
| 8,803,570 B2 | 8/2014 | Smith et al. | |
| 8,957,634 B2* | 2/2015 | Lo | H02J 7/0013 700/286 |
| 8,972,074 B2* | 3/2015 | Tyagi | G06Q 10/0631 700/286 |
| 9,041,349 B2* | 5/2015 | Bemmel | H02J 7/0013 320/109 |
| 9,106,101 B2* | 8/2015 | Senart | H02J 3/14 |
| 9,260,031 B2* | 2/2016 | Ghosh | B60L 53/65 |
| 9,283,862 B2* | 3/2016 | Bridges | B60L 53/18 |
| 9,440,547 B2* | 9/2016 | Buia | B60L 58/22 |
| 9,511,676 B2 | 12/2016 | Loftus et al. | |
| 9,620,970 B2* | 4/2017 | Gadh | H02J 13/00028 |
| 9,793,854 B2 | 10/2017 | Fornage et al. | |
| 9,843,187 B2* | 12/2017 | Uyeki | H02J 13/00001 |
| 9,927,778 B2* | 3/2018 | Mailloux | G05B 11/01 |
| 9,960,637 B2 | 5/2018 | Sanders et al. | |
| 10,110,010 B2 | 10/2018 | Lucas et al. | |
| 10,169,783 B2* | 1/2019 | Khoo | H01M 10/44 |
| 10,351,004 B1 | 7/2019 | Pastor et al. | |
| 10,504,195 B2 | 12/2019 | Sun et al. | |
| 10,926,659 B2* | 2/2021 | Lee | B60L 53/51 |
| 10,943,310 B2* | 3/2021 | Madonna | B60Q 1/1415 |
| 11,036,250 B2* | 6/2021 | Yang | H02J 3/32 |
| 11,121,577 B2* | 9/2021 | de Hoog | H02J 7/342 |
| 11,165,254 B2* | 11/2021 | Bhowmik | H02S 40/32 |
| 11,171,509 B2 | 11/2021 | Lee et al. | |
| 11,251,649 B2* | 2/2022 | Livingston | H02J 3/381 |
| 11,267,362 B2* | 3/2022 | Sadeghianpourhamami | B60L 53/64 |
| 11,270,243 B1* | 3/2022 | Roy | B60L 53/67 |
| 11,527,896 B2* | 12/2022 | Kogo | H02J 7/0013 |
| 2006/0076838 A1 | 4/2006 | Solveson et al. | |
| 2010/0193630 A1 | 8/2010 | Duces et al. | |
| 2011/0016063 A1* | 1/2011 | Pollack | B60L 58/12 320/155 |
| 2011/0116196 A1 | 5/2011 | Kellis et al. | |
| 2012/0074901 A1* | 3/2012 | Mohammed | B60L 53/11 320/109 |
| 2012/0197693 A1* | 8/2012 | Karner | B60L 53/31 705/14.1 |
| 2012/0253567 A1* | 10/2012 | Levy | B60L 53/63 701/22 |
| 2013/0020993 A1 | 1/2013 | Taddeo et al. | |
| 2013/0026986 A1* | 1/2013 | Parthasarathy | H02J 3/14 320/109 |
| 2013/0046411 A1* | 2/2013 | Al Faruque | H02J 3/322 700/286 |
| 2013/0134940 A1* | 5/2013 | Tominaga | H02J 7/0071 320/109 |
| 2014/0143002 A1* | 5/2014 | Aisu | G06Q 10/1093 705/7.18 |
| 2014/0324510 A1* | 10/2014 | Vardhan | G06Q 30/0202 705/7.31 |
| 2014/0354241 A1 | 12/2014 | Perisic et al. | |
| 2016/0026659 A1* | 1/2016 | Harley | H04W 4/44 707/758 |
| 2016/0089988 A1 | 3/2016 | Bartz et al. | |
| 2016/0164313 A1* | 6/2016 | Ohta | G05B 15/02 700/297 |
| 2016/0185246 A1* | 6/2016 | Paul | B60L 53/65 320/106 |
| 2016/0236585 A1* | 8/2016 | Miftakhov | B60L 53/665 |
| 2017/0005515 A1* | 1/2017 | Sanders | H02J 13/00002 |
| 2018/0037121 A1 | 2/2018 | Narla | |
| 2018/0123360 A1 | 5/2018 | Eaves | |
| 2018/0278168 A1 | 9/2018 | Brown et al. | |
| 2018/0358839 A1* | 12/2018 | Perez | H02J 3/46 |
| 2018/0367320 A1 | 12/2018 | Montalvo | |
| 2019/0020196 A1 | 1/2019 | Poon | |
| 2019/0058331 A1 | 2/2019 | Fuchs et al. | |
| 2019/0089241 A1 | 3/2019 | Opila | |
| 2019/0168630 A1 | 6/2019 | Mrlik et al. | |
| 2019/0378648 A1* | 12/2019 | Pratt | H02P 13/06 |
| 2019/0389315 A1 | 12/2019 | Zhu | |
| 2020/0023747 A1* | 1/2020 | Logvinov | B60L 53/66 |
| 2020/0039378 A1 | 2/2020 | Heyne et al. | |
| 2020/0064385 A1 | 2/2020 | Clark et al. | |
| 2020/0139827 A1 | 5/2020 | Koolen et al. | |
| 2020/0180465 A1 | 6/2020 | Watson | |
| 2020/0185922 A1 | 6/2020 | Hinterberger et al. | |
| 2020/0307402 A1 | 10/2020 | Poilasne | |
| 2021/0003974 A1* | 1/2021 | Yang | G05B 13/027 |
| 2021/0373518 A1 | 12/2021 | Spalt et al. | |
| 2022/0009372 A1* | 1/2022 | Bhargava | B60L 53/53 |
| 2022/0014109 A1 | 1/2022 | Ye et al. | |
| 2022/0085612 A1* | 3/2022 | Horii | B60L 53/62 |
| 2022/0089055 A1* | 3/2022 | TenHouten | H02J 7/00034 |
| 2022/0163990 A1* | 5/2022 | Veda | H02J 13/00 |

FOREIGN PATENT DOCUMENTS

| | | | | |
|---|---|---|---|---|
| CN | 111674276 A | * | 9/2020 | ............ B60L 53/30 |
| CN | 112117767 A | | 12/2020 | |
| CN | 112636577 A | | 4/2021 | |
| DE | 102011084216 A1 | * | 4/2013 | ............ B60L 53/14 |
| DE | 102013208744 A1 | * | 11/2014 | ......... B60L 11/1838 |
| DE | 102016223715 A1 | * | 5/2018 | |
| DE | 102018201060 A1 | * | 7/2019 | |
| EP | 3279839 A1 | * | 2/2018 | ......... B60L 11/1861 |
| EP | 3689666 A1 | * | 8/2020 | |
| EP | 3782849 A2 | | 2/2021 | |
| EP | 2305510 B1 | | 4/2022 | ............ B60L 53/11 |
| GB | 2586654 A | * | 3/2021 | ........... G01R 31/392 |
| JP | 4471282 B2 | | 3/2010 | |
| JP | 2014136576 A | | 7/2014 | |
| JP | 2015162959 | * | 9/2015 | |
| JP | 2015162959 A | * | 9/2015 | |
| JP | 2017135816 A | * | 8/2017 | |
| KR | 20200003318 A | * | 1/2020 | |
| RU | 2550109 C2 | * | 5/2015 | ............ B60L 53/14 |
| TW | 201711340 A | | 3/2017 | |
| WO | WO-2010042550 A2 | * | 4/2010 | ............ B60L 1/003 |
| WO | 2012154451 A2 | | 11/2012 | |
| WO | WO-2017011373 A1 | * | 1/2017 | ......... B60L 11/1838 |
| WO | 2017109094 A1 | | 6/2017 | |
| WO | WO-2018156732 A1 | * | 8/2018 | ............ B60L 50/60 |
| WO | WO-2018174027 A1 | * | 9/2018 | ............ B60L 53/22 |

* cited by examiner

AGGREGATING CAPACITY FOR DEPOT CHARGING

RELATED APPLICATION

This application is a continuation of U.S. patent application Ser. No. 17/177,498, issued on 17 Jan. 2023 as U.S. Pat. No. 11,554,684, entitled "AGGREGATING CAPACITY FOR DEPOT CHARGING," filed on 17 Feb. 2021, which is hereby incorporated by reference in its entirety.

TECHNICAL FIELD

The present disclosure generally relates to systems and methods used to convert and combine multiple power systems to provide a unified output and specifically relates to systems and methods for aggregating multiple different kinds of service capacity to support high-powered electric vehicle charging.

BACKGROUND

Electric power utility infrastructure is a serious impediment to scaled adoption of electric vehicles (EVs), particularly in a work setting where fleets of EVs need to be powered. Operators of buses, trucks, and delivery vans who are contemplating rollouts beyond pilot scale are often told by utilities that an infrastructure upgrade is required to support the charging of those vehicles, often at great expense to the customer and utility and with vague and uncertain project work timelines. Utilities usually have limited capability to adapt due to overburdened engineering departments whose primary objective is the safety and reliability of the grid as a whole rather than processing and implementing upgrades for particular customers. Accordingly, this added complexity, cost, and delays are significant roadblocks to widespread electrification of vehicles, and especially fleet vehicles which, as a fleet, require high capacity and reliability for their charging power in order to operate efficiently. For this and other reasons, there is a constant need for improvements in the field of EV charging and the provision of power to EV fleets.

SUMMARY

One aspect of the present disclosure relates to an electric vehicle charging system comprising a first utility grid connection having a first alternating current (AC) signal having a first signal type, a second utility grid connection having a second AC signal having a second signal type, an electric vehicle charging device, and an electrical bus system in electrical communication with the first and second utility grid connections and with the electric vehicle charging device. The electrical bus system can be configured to convert the first and second AC signals to a direct current (DC) signal and to convert the DC signal to an output signal for the electric vehicle charging device.

In some embodiments, the charging system also comprises a first electrical service panel electrically connected to the first utility grid connection, a first rectifier electrically connected to the first electrical service panel and to the electrical bus system, a second electrical service panel electrically connected to the second utility grid connection, a second rectifier electrically connected to the second electrical service panel and to the electrical bus system, and an inverter electrically connected between the electrical bus system and the electric vehicle charging device.

In some embodiments, the charging system comprises an energy storage device electrically connected to the electrical bus system and configured to provide energy to, or store energy from, the electrical bus system. A controller can be included that is configured to determine available power from the first utility grid connection and from the second utility grid connection, determine demand at the electric vehicle charging device, and control the electrical bus system to draw from the available power to supply the demand at the electric vehicle charging device. In some configurations, determining available power can comprise comparing an upper limit of a capacity of the first utility grid connection to present usage of the capacity. Drawing from the available power can comprise prioritizing power drawn from the first utility grid connection over power drawn from the second utility grid connection. The prioritization can be based on a tariff or time-of-use price of electricity.

In some embodiments, the charging system can comprise an energy generation or energy storage system electrically connected to the electrical bus system, and the electrical bus system can be configured to provide energy from the energy generator or energy storage system to the electric vehicle charging device. The energy generation or energy storage system can comprise an energy storage device electrically connected between the first utility grid connection and the electrical bus system.

Another aspect of the present disclosure relates to a method of managing electricity usage to charge electric vehicles, wherein the method comprises detecting a demand for an electric vehicle charging device connected to a utility customer site, determining a first power margin of a first power source connected to the utility customer site, determining a second power margin for a second power source connected to the utility customer site, with the first and second power sources having different power supply characteristics, drawing power from the first power source at a first power level within the first power margin and from the second power source at a second power level within the second power margin, and providing the drawn power to the electric vehicle charging device.

The first power margin can be based on an electrical service capacity of the first power source. The first power margin can also be based on time of use of the first power source or based on a previous peak consumption threshold for the first power source. In some embodiments, drawing power from the first power source and from the second power source comprises supplying power to an electrical bus, and wherein providing the drawn power to the electric vehicle charging device comprises supplying power from the electrical bus to the electric vehicle charging device. The method can further comprise providing supplemental power to the electric vehicle charging device from an energy storage device.

Yet another aspect of the disclosure relates to an electric vehicle charging system, comprising a first utility grid connection of a utility customer and at a site of the utility customer, a first service panel connected to the first utility grid connection, a second utility grid connection of the utility customer at the site, a second service panel connected to the second utility grid connection, an electric vehicle charging device of the utility customer at the site, a bus connecting the first and second service panels to the electric vehicle charging device, and a controller configured to manage power provided to the electric vehicle charging device via the bus.

In this system, the first utility grid connection and the second utility grid connection can provide different voltage access to a utility grid. The first utility grid connection and the second utility grid connection can also provide different phase-level access to a utility grid. The first service panel can comprise a first trip rating and the second service panel comprises a second trip rating, wherein the controller is configured to prevent power drawn from the first and second service panels from exceeding the respective first and second trip ratings. In some embodiments, the system further comprises an energy storage system connected to the bus, wherein the controller is configured to store excess energy from the first and second service panels using the energy storage system or to provide supplemental energy from the energy storage system to the electric vehicle charging device.

The above summary of the present invention is not intended to describe each embodiment or every implementation of the present invention. The Figures and the detailed description that follow more particularly exemplify one or more preferred embodiments.

BRIEF DESCRIPTION OF THE DRAWINGS

The accompanying drawings and figures illustrate a number of exemplary embodiments and are part of the specification. Together with the present description, these drawings demonstrate and explain various principles of this disclosure. A further understanding of the nature and advantages of the present invention may be realized by reference to the following drawings. In the appended figures, similar components or features may have the same reference label.

Figure 1A:
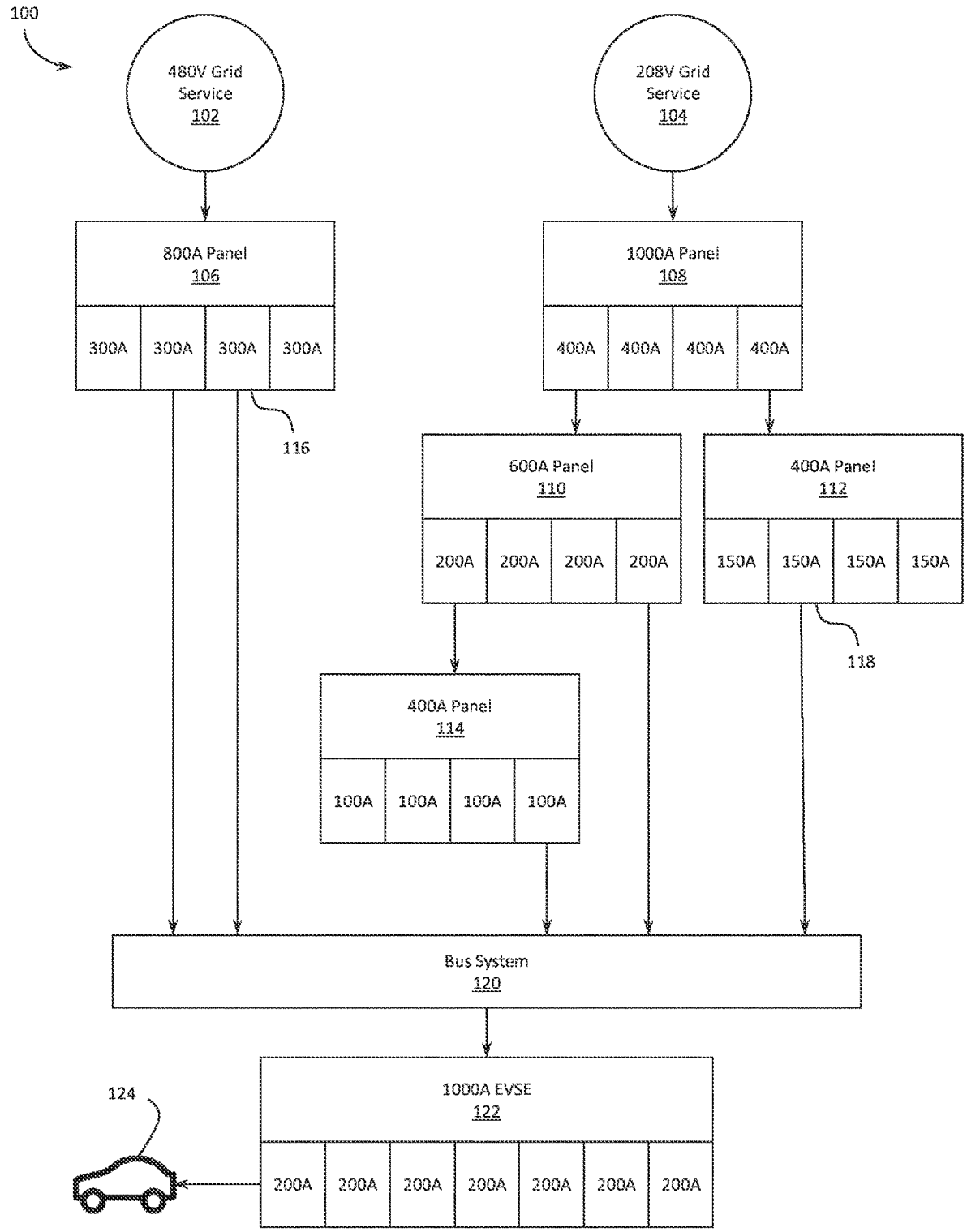
FIG. 1A is a block diagram of an electric vehicle charging system.

While the embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION

Embodiments of the present disclosure can help address challenges faced by utilities and utility customers when installing and using electric vehicle charging stations by providing systems and methods that permit high power and high reliability charging stations to be operated at existing customer sites without needing utility service upgrades or significant changes to existing utility service at those sites.

Some embodiments include aggregating unused capacity from multiple end-user utility service meters into a larger single block of available capacity that is provided to EV service equipment (EVSE) such as EV chargers. The aggregated available capacity or available power can be containerized and can be used with energy storage systems to improve output consistency and leveling. Thus, utility customers or other site operators having multiple electrical panels that, individually, would not effectively provide sufficient capacity to support EV charging (or fleet EV charging) can collect and use their otherwise unused capacity for those panels to provide power to a bus system with sufficient capacity for those purposes. Embodiments of the present disclosure can improve the rate of adoption of EV fleets at scale while minimizing utility service upgrades, can monetize spare utility capacity for underutilized service and assets, can enable grid services (e.g., demand response) and centralized, aggregated controls for grid operators for fleet EV charging, and can keep these systems secured and isolated from tampering by using a centralized controller.

In an example embodiment, an electric vehicle charging system is provided that includes a first utility grid connection having a first alternating current (AC) signal type (or a high voltage direct current (HVDC) signal type), a second utility grid connection having a second AC signal type (or another HVDC signal type), an electric vehicle charging device, and an electrical transfer bus system in electrical communication with the first and second utility grid connections and with the electric vehicle charging device. The electrical transfer bus system can be configured to convert the first and second AC signals (or HVDC signals) to a direct current (DC) signal and to convert the DC signal to an output signal for the electric vehicle charging device. Thus, the charging system can adapt and combine the capacity of two different utility grid connections (i.e., the first and second utility grid connections) using an electrical transfer bus system that converts the signals from their AC (or DC) sources to a DC signal that is usable as an output to an electric vehicle charging device. The combined power can be greater than would otherwise be possible using the first or second utility grid connections on their own, thereby unlocking the potential of those grid connections without having to modify the connections themselves. Instead, an electrical transfer bus system can be installed and connected to those grid connections, and a controller can manage the amount of power drawn from each connection to provide an amassed, collected, unified amount of power.

In some embodiments, the systems and methods described herein can adapt and combine the output of multiple different types of power sources to connect to the bus system. For instance, one or more of a residential-grade utility grid connection, a commercial-grade utility grid connection, an energy storage system (ESS), a fuel-based generator (e.g., diesel generator), a renewable generator (e.g., a solar panel or geothermal/wind turbine), similar devices, and combinations thereof can be connected to a single bus system for aggregation and output unification. Multiple power sources can be managed and owned by a single utility customer, or some/all can come from multiple different utility customers. In some embodiments, the connection between these power sources can be one-directional, such as in the case of a utility grid connection being connected to the bus system via a rectifier, and in some cases, the connections can be bidirectional, such as a connection between an ESS and the bus system, wherein energy can either be drawn from the ESS to the bus or energy can be directed from the bus to the ESS and stored thereon.

In an example embodiment, output of the aggregation system can provide a minimum of 100 kilowatts of charging power to at least ten EV chargers used to charge a fleet of EVs at a single centralized depot location. Controllers connected to the bus system, the power sources (e.g., at service panels), converters (e.g., at rectifiers and inverters connected to the bus system), and EV depot management information can track power usage from each input source, track consumption at each EVSE device, ensure security, load-balance the usage of the input sources to minimize peak-power utility usage demand charges (e.g., demand charges based directly on the highest peak power level consumed within a subdivision of a billing period or based directly on the highest average power level of a subdivision of the billing period), respond to grid signals for demand response events, provide emergency operations in case of grid-level outages using local energy storage and generator, and, for networks of connected controllers, react in a unified manner to various needs and events. An example embodiment can be configured to serve 1 Megawatt of demand with an aggregated 500 kilowatts of capacity (as an indication of ratio) through a combination of aggregating unused power capacity, providing power from energy storage (e.g., in a "surging" capacity), and using software-controlled load balancing, all without needing a utility service upgrade.

In some embodiments, a method and system are provided that physically aggregate electrical points of common coupling (PCC) with generally current-constrained electrical panels to allow for the energization and utilization of one or multiple high-power loads, such as EVSEs (e.g., EV chargers). To accomplish this, multiple electrical sources can be connected together through a series of power electronics that enables the sources to effectively be turned "on" or "off" (to the bus) by a controller. Any sources that are turned "on" simultaneously enable an aggregate combined output to be available to the EVSE devices. In specific topologies where energy storage is utilized, an added benefit of allowing finite duration "bursts" of power can be supported based on storage capacity size and EVSE demand.

Each electrical source can be individually monitored upstream to prevent tripping of over current protection devices or achieving power demand levels above desired thresholds. The available power margin for each source of power based on at least one of: the electrical service capacity (e.g., based on demand of active loads at the site), an optimized peak demand threshold (e.g., using customer- or system-controller-defined constraints such as tariff, time of use (e.g., time-of-use pricing), and peak demand charge information), main over current trip rating in power, and breaker trip rating used to connect to the aggregate power network/bus. Once an electrical source is enabled, power conversion devices can be used to pull power from the source at a desired level or up to the maximum allowed level, or, signals can be sent to the downstream loads (e.g., EVSEs) to curtail the maximum power draws to the maximum allowed level.

In embodiments where an ESS is employed, the power that is drawn from each source can be stored by the ESS, and the utilization of the energy can be controlled as a second stage event that occurs separate and independent of the event of drawing power from the sources.

The present description provides examples, and is not limiting of the scope, applicability, or configuration set forth in the claims. Thus, it will be understood that changes may be made in the function and arrangement of elements discussed without departing from the spirit and scope of the disclosure, and various embodiments may omit, substitute, or add other procedures or components as appropriate. For instance, the methods described may be performed in an order different from that described, and various steps may be added, omitted, or combined. Also, features described with respect to certain embodiments may be combined with or included in other embodiments.

FIG. 1A is a block diagram of an electric vehicle charging system 100. The system 100 can include a first utility grid connection 102 and a second utility grid connection 104. Each grid connection 102, 104 can be connected to an electrical service panel 106, 108. The electrical service panels 106, 108 can be connected to one or more electric service sub-panels (e.g., 110, 112, 114). The electrical service panels 106, 108 can be connected to an electrical bus system 120 which is connected to an output panel 122 (or directly to EVSE devices/EV chargers). The output panel 122 can be connected to EVSE devices/EV chargers such as, for example, chargers connectable to or carried by an EV 124.

The utility grid connections 102, 104 can include service connections to an electrical utility distribution grid. System 100 comprises two utility grid connections 102, 104, but additional grid connections, or a single grid connection, can be used in the system 100. For instance, any additional grid connection can be connected to the bus system 120 in parallel to the other grid connections 102, 104. The grid connections 102, 104 can comprise capability ratings and electrical characteristics that are different from each other. In some embodiments, the grid connections 102, 104 can provide different voltages (e.g., 480 volt grid service from grid connection 102 and 208 volt grid service from grid connection 104), different alternating current (AC) signals (e.g., single phase grid service (each having the same or different voltages) or three phase grid service (each having the same or different voltages)), different current ratings, and different usage grades or permits from the utility provider. For example, one grid connection can be an industrial-, commercial-, or non-residential grade utility connection and another grid connection can be a residential-, non-industrial-, or non-commercial grade utility connection.

The type and characteristics of the grid connections 102, 104 of the system can be determined or monitored by a controller (see e.g., FIG. 3), and the controller can be capable of managing and controlling the system 100 in different ways based on the type and characteristics determined or monitored. For example, an industrial grid connection may be capable of participating in a demand response program with a utility provider whereas a residential grid connection may not be permitted to participate in such a program. Similarly, a commercial grid connection may be subject to different billing practices as compared to a residential grid connection, such as the commercial grid connection being subject to peak rates or peak usage demand charges that are not assessed to customers using a residential grid connection. Notably, the grid connections 102, 104 of the system 100 can be part of a single customer's site or can be owned and/or operated by a single utility customer. In some embodiments, the grid connections 102, 104 can be operated by multiple customers or located at multiple customers' sites (e.g., at least two customers' sites). Thus, the system 100 can aggregate multiple sources from a single utility customer or can aggregate sources from multiple utility customers. In this manner, the system 100 can be used to improve usability of systems with multiple service connections, including mismatched connections, even if the systems are used by different utility customers or are underutilized by a single customer. In some embodiments, the grid connections 102, 104 can each comprise a utility meter configured to track consumption of energy and/or power from the utility grid to which they are connected.

The service panels 106, 108, 110, 112, 114 can be utility service panels used to provide control and limits on the usage of the electrical utility service connections or other power sources to which they are connected. In some embodiments, a single service panel (e.g., 106 and 108) is in electrical communication with a respective different grid connection (e.g., 102 and 104) and with the bus system 120, and there are no intervening sub-panels (e.g., 110, 112, 114). In other cases, the sub-panels 110, 112, 114 are included and further control and limit the provision of power from a panel (e.g., 108, 110) to the bus system 120. The service panels 106, 108, 110, 112, 114 can each have a rating, trip level, power or current capacity, or other similar electrical characteristic indicating their capability for providing power to loads connected to the panel. For instance, panel 106 can have an 800-amp rating, panel 108 can have a 1000-amp rating, panel 110 can have a 600-amp rating, panel 112 can have a 400-amp rating, and panel 114 can have a 400-amp rating. Accordingly, those ratings represent the maximum amps that can be drawn from each respective panel. Generally, higher-rated panels can be electrically connected closer in a circuit to the grid service connections 102, 104, and lower-rated panels can positioned electrically further from the grid service connections 102, 104, such as by being connected as a sub-panel to another panel.

Each of the service panels 106, 108, 110, 112, 114 can comprise a set of circuit breakers (e.g., 116, 118) configured to be connected to loads or energy sources at the customer site. The breakers can be configured to limit the power level provided to those loads or sources relative to the overall rating of the respective service panels (e.g., 106, 112) to which they are connected. For example, FIG. 1A shows that breaker 116 can have a 300-amp capacity while the service panel 106 has an up to 800-amp capacity. In some embodiments, the service panels have a plurality of breakers that may have individual capacities that, when combined, exceed the overall rating of the service panel to which they are connected. Breaker 116 has an 800-amp rating, but its individual breakers (e.g., 116) are shown with a combined capacity of 1200 amps. A similar situation applies to panels 108, 110, and 112. Service panel 114 comprises breakers having a combined capacity equal to the capacity of the panel 114, but it may still be undesirable to draw power at the full rated capacity of the breakers due to fluctuations in demand that could drive consumption beyond the panel's rating, thermal issues, measurement error, and other concerns. Accordingly, not all of the breakers can be used to maximum capacity at all times, and the bus system 120 can be controlled to avoid exceeding service panel ratings while also preventing exceeding individual breaker capacity. To do so, power meters (e.g., ammeters) can be configured to measure consumption at each of the panels 106, 108, 110, 112, 114, and those meters can provide their measurements to the controller connected to the bus system. In some embodiments, power meters are configured to measure consumption only at the service panels directly connected to the bus system 120 (e.g., panels 106, 112, and 114) since the power drawn via the bus system 120 directly affects those panels.

The bus system 120 can comprise a plurality of converters (e.g., rectifiers and inverters), a direct current (DC) voltage bus, energy storage systems, and generator systems. See FIG. 2 and its related descriptions herein.

The output panel 122 can comprise a service panel with its power supplied by the bus system 120. The output panel 122 can therefore be indirectly powered by the utility grid since it has no direct connection to a power source such as the grid connections 102, 104. The output panel 122 can be connected to (or part of) an electric vehicle charging system (e.g., EVSE) configured to output power to connected EVs (e.g., 124) through one or more charging stations. Charging equipment can have individual breakers that can be monitored and managed by a controller to ensure that the service capacity of the output panel 122 is not exceeded. Loads and devices can be monitored by power meters connected at the loads or to their breakers/service panels from which they receive power.

Figure 1B:
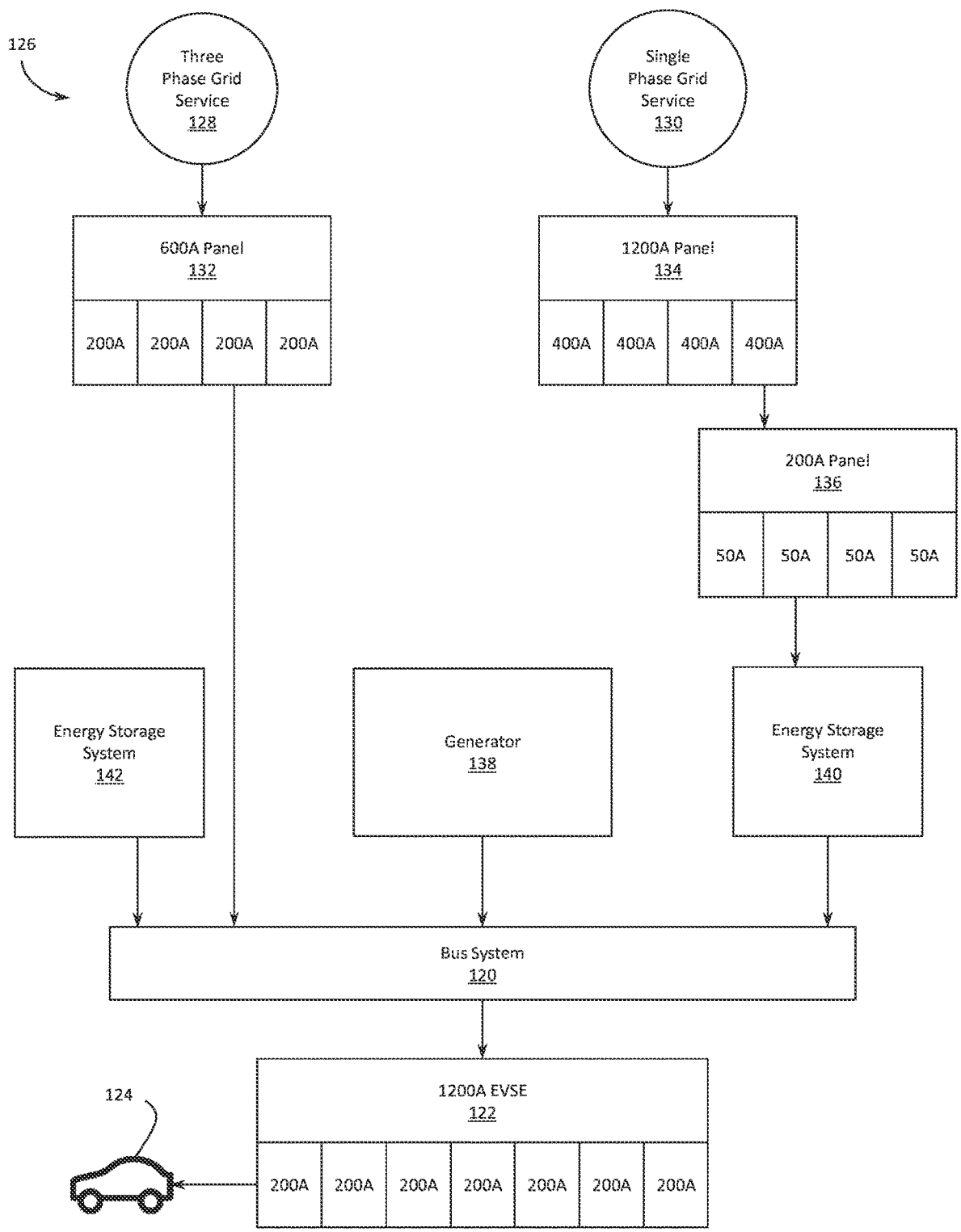
FIG. 1B is a block diagram of another electric vehicle charging system.

FIG. 1B shows an alternative embodiment of a system 126 similar to system 100. For convenience, elements of system 126 having similar names to elements of system 100 can have the same characteristics and features, subject to any differences described below. Thus, system 126 can include a set of utility grid connections 128, 130 connected to a set of service panels 132, 134, 136 having sets of breakers. The system 126 can also comprise a generator 138 and/or energy storage systems 140, 142 connected to the bus system 120 with an output panel 122 for providing charge to electric vehicles. The energy storage systems 140, 142 and generator 138 are optional devices for the operation of the system 126 and can individually or collectively excluded based on customer and operator needs. In some embodiments, these devices 138, 140, 142 can also be reconfigured, such as in a case where the generator 138 is connected to a service panel (e.g., 134), to an energy storage system (e.g., 142), to the output panel 122, etc. In some embodiments, an energy storage device can be used in place of the bus system 120, and the energy storage device's internal bus can be used as the bus system for the overall EV charging system 126.

The generator 138 can comprise a local generator at the customer site that is configured to provide power to the bus system 120. The generator 138 can be fuel-based, such as a diesel generator, and can be configured to use the fuel to produce power at the command of the customer and/or in response to operation of a system controller.

The energy storage systems 140, 142 can comprise one or more energy storage devices configured to charge to store energy provided by the grid connections 128, 130 or generator 138 (e.g., via the electrical connection between bus system 120 and the grid connections 128, 130 or generator 138). The energy storage systems 140, 142 can also be operated to discharge energy to the bus system 120 to provide power to the output panel 122. In some embodiments, the energy storage systems 140, 142 can comprise battery, flywheel, capacitor/super-capacitor devices, related devices, and combinations thereof. The energy storage systems 140, 142 can be controlled to charge to "absorb" excess power provided to the bus system 120 when demand at the output panel 122 is lower than the power provided to the bus system 120 from other sources. An ESS can be controlled to discharge to supplement the power provided to the bus system 120 when demand at the output panel 122 exceeds power provided from other sources. In this manner, the energy storage systems 140, 142 can improve the consistency and reliability of power provided from the bus system 120 to the output panel 122. Additionally, the energy storage systems 140, 142 can be used to feed power to the grid connections 128, 130 for implementing energy arbitrage, load leveling, demand response, frequency response, and other related cost savings activities.

As shown in FIG. 1B, an energy storage system 140 can be positioned electrically between or in series with a grid connection 130 and associated service panels 134, 136. The ESS 140 can thereby be charged directly from a breaker of a service panel (e.g., 136) and, in some cases, can directly provide power back to the service panels 136, 134 and their associated grid connection 130. In this configuration, the ESS 140 can provide consistent power to the bus system 120 by using its energy storage capacity to compensate for lags or surges in available power from the grid connection 130 or related service panels 134, 136.

FIG. 1B also shows an energy storage system 142 connected directly and solely to the bus system 120, thereby illustrating that an ESS 142 can be charged and discharged solely and directly by the bus system 120. See also ESS 214 of FIG. 2. With this configuration, the ESS 142 can be used to stabilize the power output of the bus system 120 to the output panel 122 or to other connected devices (e.g., ESS 140 or devices connected to panel 132) and can be used to collect and store energy from multiple sources (e.g., 128/132 and 138) for faster and higher-capacity charging as compared to an ESS 142 only connected to one power source.

Figure 2:
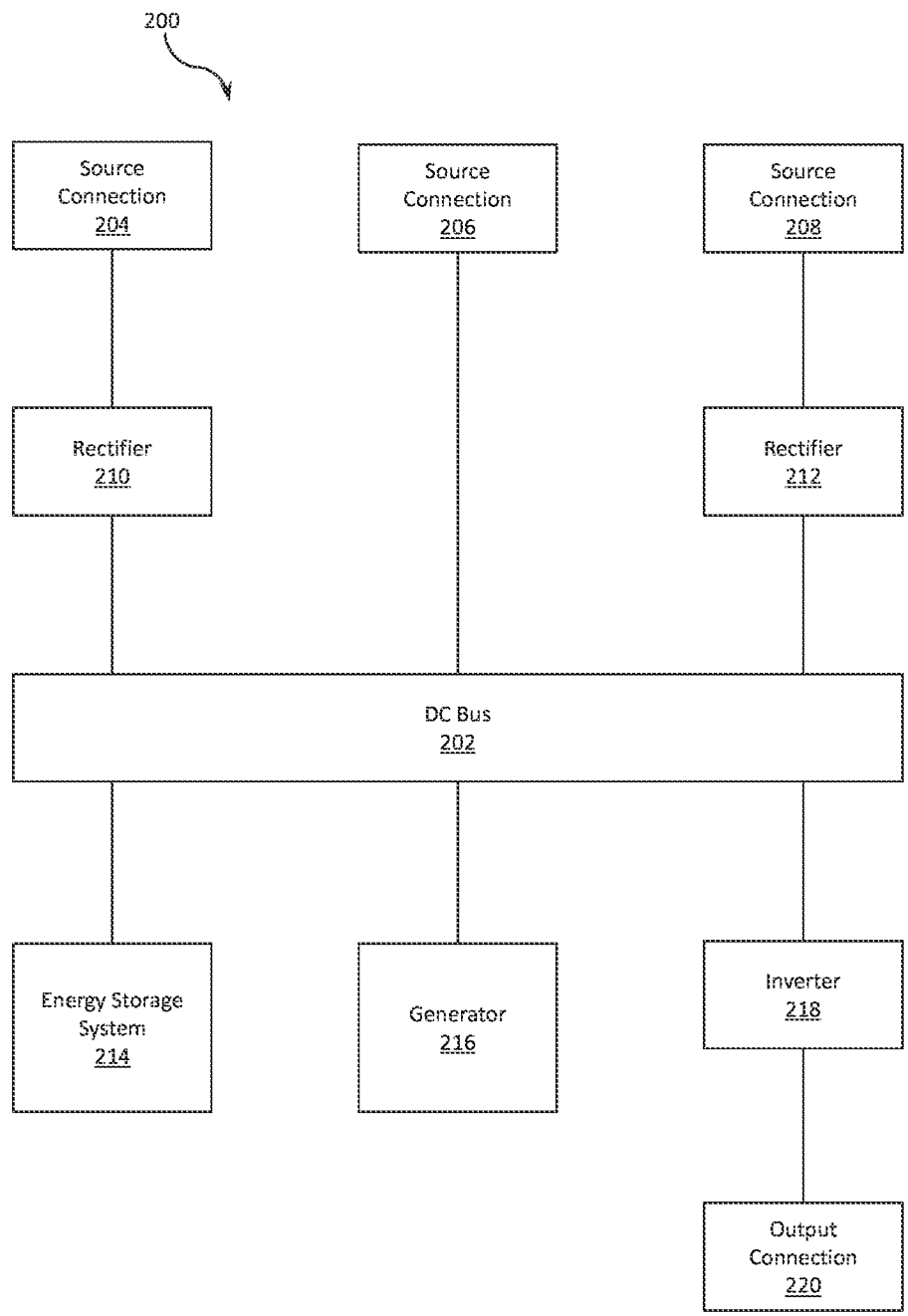
FIG. 2 is a block diagram of a bus system of the embodiments of FIGS. 1 and 2.

FIG. 2 is a block diagram of a bus system 200 according to an embodiment of the present disclosure. The bus system 200 can be an embodiment of the bus system 120 of FIGS. 1A and 1B. The bus system 200 can include a DC bus 202 configured to connect to at least one source connection 204, 206, 208 directly (as in source connection 206) or one or more power converters 210, 212 (as represented in this example by rectifiers). The bus system 200 can also include an energy storage system 214 and generator 216 directly electrically connected to the DC bus 202. The DC bus 202 can also be connected to a power converter (e.g., inverter 218) configured to convert an output signal to an output connection 220.

The DC bus 202 can be a high voltage bus configured to facilitate transfer of power from the multiple source connections 204, 206, 208, 214, 216 (e.g., via power converters 210, 212) to the inverter 218. The DC bus 202 can therefore have a voltage to which the various connected devices are converted or maintained to ensure the compatibility and stability of the DC bus 202.

The source connections 204, 206, 208 can be connections to service panels (e.g., 106, 112, 114, 132) or other power sources (e.g., ESS 140, ESS 142, or generator 138). When a source provides an AC signal to a source connection, a rectifier (e.g., 210, 212) can be used to convert the AC signal to a DC signal compatible with the DC bus 202. In some embodiments, the power converters 210, 212 can be DC-DC step up/step down converters, phase converters, similar devices, and combinations thereof as needed to ensure that a signal from a source connection is properly compatible with the DC bus 202. Additionally, in some cases, a power converter can be omitted for at least one source connection (e.g., 206) due to the source being configured to output a signal having directly compatible electrical characteristics (e.g., the same voltage) with the DC bus 202. The inverter 218 can be a DC-to-AC inverter that provides an AC output to the output connection 220, which in turn can provide AC output to an output panel (e.g., 122) or EVSE.

The bus system 200 can thus include a number of converters and different kinds of control equipment that manages and combines the signals coming from multiple source connections 204, 206, 208 to provide high power to an output connection 220. In some embodiments, the power provided to the output connection 220 is therefore a summation of the power provided from the source connections 204, 206, 208. Furthermore, the bus system 200 can be used to at least temporarily provide higher power than would be possible using only the source connections 204, 206, 208 by supplementing that power with output from the energy storage system 214 and/or generator 216. Accordingly, the bus system 200 can enable charging of fleets of electric vehicles at a site where individual service panels and grid connections are insufficient to power one or more EVSE devices simultaneously due to aggregation and combination of the power sources followed by providing a unified (and, in some cases temporarily boosted and amplified) output signal.

Figure 3:
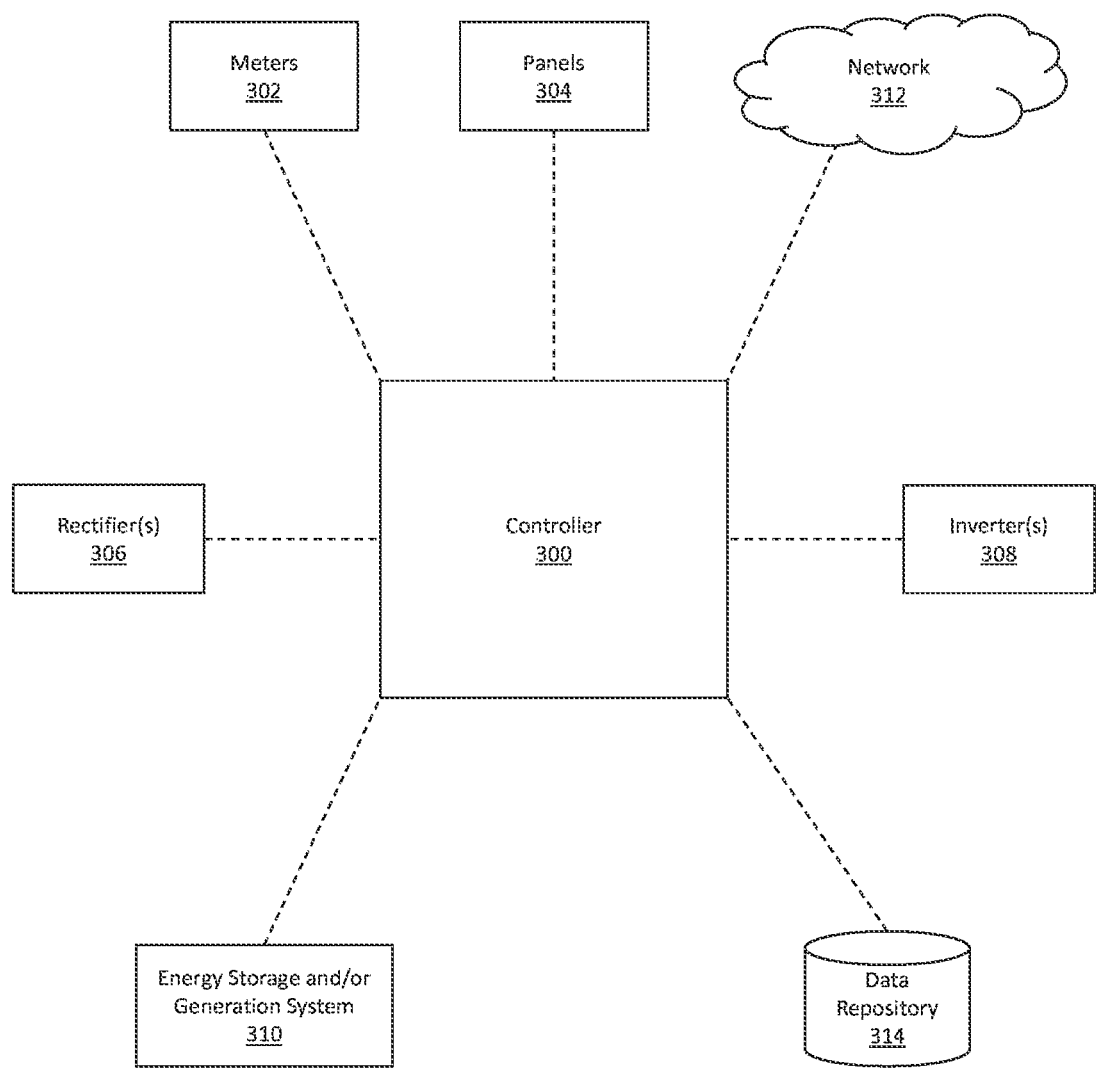
FIG. 3 is a block diagram of a controller system.

Control of the bus system 200 can be provided by a controller 300 such as the controller illustrated in the block diagram of FIG. 3. The controller 300 can be a computing device in electrical communication with various other components of the systems 100, 126, 200 described herein, as indicated by the dashed-line connections in FIG. 3 that link the controller 300 to meters 302, panels 304, rectifiers 306, inverters 308, and energy storage and/or generation system 310. Connections can be added or removed to adapt the controller 300 to the scale and number of systems at a given customer's site. The meters 302 can comprise ammeters or other power meters configured to measure energy consumption from the grid or other power sources at the customer site(s) monitored and controlled with the controller 300. Meters 302 can also be installed at various points in the system, including at an ESS, at a generator, at the bus system or power converters, at the output panel 122, at EVSE, etc. to track the operation and usage of each component as needed to maintain consistent operation, to react to changes in loads and supply, and to track and store usage data over time for later analysis and forecasting. The panels 304 can be service panels or breakers that are monitored by the controller 300 (e.g., the service panels and breakers of FIGS. 1A and 1B). The rectifiers 306 and inverters 308 can comprise one or more of the power converters shown and described in connection with FIG. 2, and the energy storage and/or generation system 310 can comprise one or more of the energy storage systems and generators described in connection with FIGS. 1B and 2.

The controller 300 can be configured to receive and/or send signals to each of the devices to which it is connected. In some embodiments, the controller 300 can receive usage indication signals from the meters 302, panels 304, rectifiers 306, inverters 308, and/or energy storage systems/generation systems 310. In this manner, the controller 300 can monitor various points in the systems 100, 126 described above to determine how much of the rated capacity of the service panels, grid connections, energy storage systems, generators, etc. is being used on a consistent (e.g., real-time) basis and can use that information to determine how much power to draw from the service panels, energy storage systems, generators, etc. (e.g., via the rectifiers 306 or other power converters connected to the controller 300). The controller 300 can also use that information to manage how much power is provided to an output panel (e.g., 122) so that EVs and EVSE devices can be controlled to charge at rates that will be achievable based on the power available from the various source connections, ESS, and generators.

The controller 300 can also be in electrical communication with a network 312 and a data repository 314. The network 312 can be a computer network, such as a utility grid communications network (e.g., the Internet, a local area network, a wide area network, etc.) used for communicating demand response and other grid participation requests and commands from a utility-level demand response manager or clearinghouse. Thus, the controller 300 can receive and respond to these signals by adjusting the available power for EV charging or redirecting power from an ESS or generator to the grid as needed or desired. In some embodiments, the network 312 can connect the controller 300 to a controller for another system like system 100 or 126. In this manner, the controller 300 can interact with other controllers to coordinate power output, schedule charging or other power usage based on EV usage forecasts, track efficiency, aggregate usage statistics, etc. The data repository 314 can comprise one or more electronic storage devices or databases connected to the controller 300. In some cases, the data repository 314 can store information about the system to which the controller 300 is connected, such as by containing information about the power ratings or capacities of the panels 304, rectifiers, 306, inverters 308, other converters, and ESS/generator 310. Thus, the controller 300 can access the data repository 314 to compare the measured electrical characteristics of those devices (e.g., the power usage of a breaker as determined by a meter (e.g., 302)) to the rated characteristics of those devices (e.g., the rating of the breaker) to calculate an available power characteristic for the devices, converters, or other assets.

The controller 300 can comprise a computing system made of a plurality of computing devices configured to control and monitor the electric vehicle charging systems and related components described herein. A controller 300 can therefore be used to monitor electrical sources and make decisions (based on a set of electronic instructions) that are based on known constraints (e.g., panel or ESS throughput ratings), desired outputs (e.g., maintaining a desired output kW to the output panel 122), and real time measurements read and reported by meters 302 (e.g., the present consumption at a panel or the amount of power being converted at a rectifier). Decisions of the controller 300 can be implemented by sending signals to power converters, controllable/curtailable loads, and other auxiliary systems to enable or disable a power source and to match the aggregate supply with the aggregate load.

High accuracy electrical meters can be used that help measure real-time loads and conditions for each power source. The readings from these meters can give the controller accurate and precise data points enabling the controller to make decisions quickly enough to prevent open circuit protection (OCP) devices from tripping or power thresholds from being violated. In some embodiments, meters can be used that push signals to controllers to mitigate timing issues, and a controller can poll the meter for data with some latency introduced in the poll interval or data conversion or processing within the meter. An event-driven signal that is triggered on the cycle basis to shed load can be used to prevent a trip of OCP devices. In addition, OCP devices can be programmable to include a trip delay to allow for some toleration of over currents based on the magnitude or time of the detected currents.

Converters (e.g., rectifiers) can be push/pull type and can be used with an ESS based on commands and targets determined by the controller 300. The converters can thereby act as a controlled electrical "gate" enabling precise power flow to be commanded or allowed from specific sources at specific times.

The ESS can comprise a DC bus and can be capable of storing energy. The ESS can be used as a buffer by the controller 300 to break dependency of real-time loads from needing to exactly match the supply (or vice versa). In some embodiments, the DC bus can include an externally-controllable DC-DC converter or an exposed system that can provide "gate"-like control functionality to the controller connected to the DC bus.

Controllable loads (e.g., connected to the panels 304 or connected directly to the controller 300) can be configured to receive signals from the controller to become aware of available (or deficient) upstream power. Thus, the controllable loads can be operated by the controller 300 to help limit or increase available supply or demand on the DC bus system.

Figure 5:
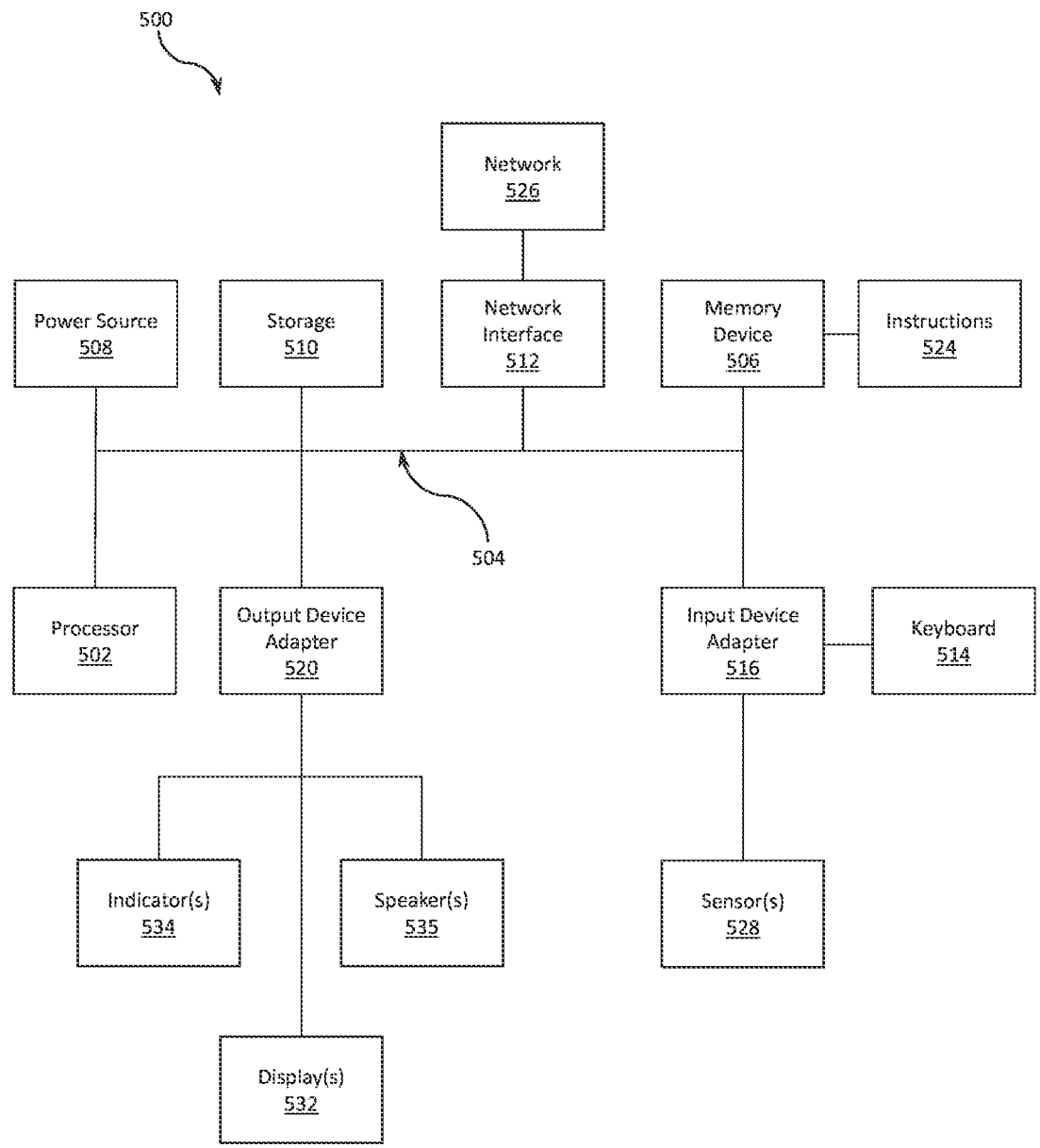
FIG. 5 is a block diagram of a computer system.

Using the controller 300 can enable dynamic monitoring and balancing of local power supply and demand at a micromanaging, individual load (or source) level with load curtailments. FIG. 5 illustrates an embodiment showing component parts and relationships of an example controller system, as explained in further detail below.

Figure 4:
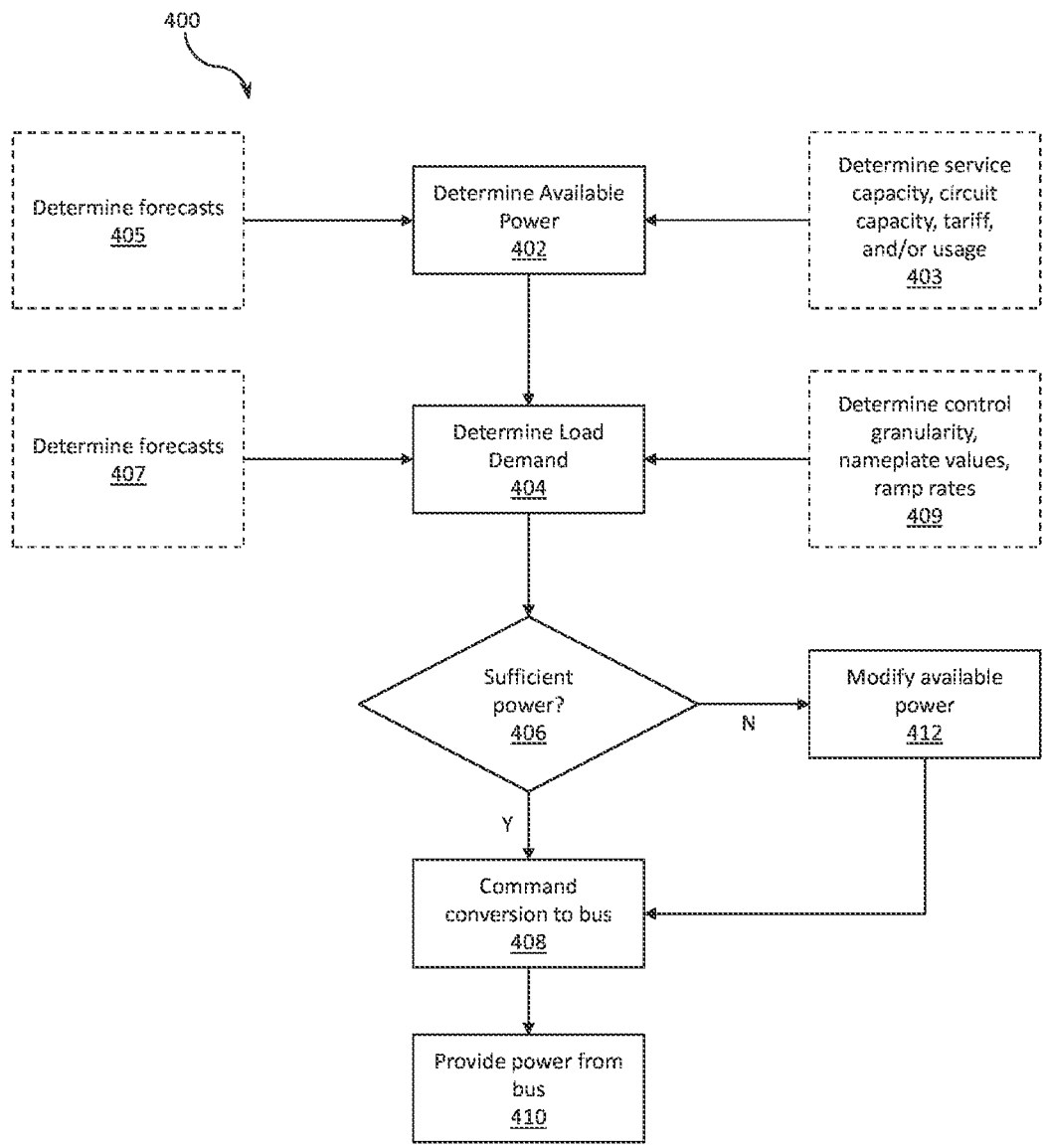
FIG. 4 is a process flow diagram of processes for controlling a bus system and various electronic components of an electric vehicle charging system.

FIG. 4 shows a flow diagram of illustrating embodiments of a process 400 or executable instructions that can be performed by the systems described herein. In some embodiments, the process 400 can be performed by a controller (e.g., 300) in connection with other components of one or more systems described herein. The process 400 can include determining available power, as indicated in block 402. The available power can be determined for various power sources at the customer site, such as for each grid connection (e.g., 102, 104, 128, 130), each service panel (e.g., 106, 108, 110, 112, 114, 132, 134, 136), each breaker (e.g., 116, 118), each generator (e.g., 138, 216), each ESS (e.g., 140, 142, 214), and/or each power converter (e.g., 210, 212, 218).

In some embodiments, available power for a device (i.e., power margin) can be defined as an amount of unused capacity for that device. For example, the available power can be the difference between the rated capacity of a breaker and the currently-used capacity of the breaker. In some embodiments, available power can be determined based on electrical service capacity of a grid connection or the site as a whole or a main over-current trip rating (in power levels or current measurements). In some embodiments, available power can be further modified based on user preferences (e.g., rather than using the rated capacity (i.e., trip rating)), the available power can be determined by using a user-defined maximum power on a system-wide or per-device basis), utility mandates (e.g., utility-defined reserve limits for the device in question), forecasts (e.g., saving capacity for anticipated consumption fluctuations or future planned consumption), related elements, and combinations thereof. In one example, available power can be defined in part by forecasted or planned consumption at the output panel 122, such as when EVs are scheduled to connect to and charge at EVSE devices.

In some embodiments, available power can be defined based on economic constraints such as limits that change in response to tariff, time-of-use pricing, or peak demand charge levels. For instance, available power from an ESS can be limited when peak demand charge-incurring power levels for a subdivision of a billing period have been approached by the system so that future demand charges can be mitigated by the ESS. Some of these optional alternative inputs are indicated in block 403. Available power from an ESS can also be modified (e.g., reduced) when the ESS is expected to enter an inefficient state of charge, temperature, state of health, or other detrimental condition wherein using the ESS could be dangerous or deleterious to the future capacity or effectiveness of the ESS in the system. In some embodiments, the available power can be defined as an amount of available power over time, such as a forecasted available power over an upcoming period of time, as indicated in optional block 405. The available power determined in block 402 can therefore change over time, and an anticipated available power can be used to take actions in advance, as described in further detail below.

In some configurations, available power can be determined on a per-source level, wherein available power of each source connection to a bus system can be calculated before being combined together in block 402. Individual available power values for individual units can be controlled to adjust the way the process 400 uses each unit. For example, the available power for a first power source and the available power for a second power source can be controlled to ensure that the first power source is used prior to the second power source (or vice versa), that output rates from each power source ramp at certain speeds or with certain timing, or that similar timing and sequence commands are followed. Similarly, the ramp rates for first and second power sources can be controlled so that, for example, one source ramps more quickly or more slowly than another source so that their maximum output stages do not, at least initially, overlap each other, thereby ensuring that the electrical constraints on the bus system are kept within desired tolerances.

The process 400 can also include determining load demand, as indicated in block 404. The load demand can refer to the level of demand that is needed (or will imminently be needed) at the output panel 122 or EVSE devices. Thus, the load demand determined can include a demand for EV charging at the site, such as by detecting an EV connected to the site, detecting how much power it is requesting to use to charge, forecasting the arrival of an EV or segment of a fleet of EVs, etc. This load demand can be determined based on power draw of loads (e.g., EVs) connected to the output panel 122 or at service panels and breakers (e.g., in systems 100 and 126). The load demand can be a real-time determined value (e.g., amps being used by a particular set of breakers at a particular time) or can be a forecasted set of current and future values (as indicated by block 407). Additionally, the process 400 can include determining control granularity, nameplate values, and ramp rates to help determine the load demand for one or more loads on the system, as indicated in block 409.

The process 400 can then include determining whether sufficient power is available, as shown in block 406. In some embodiments, this includes determining whether the current or expected available power is greater than the current or expected load demand. If sufficient power is available, the process 400 can include commanding the bus system to implement a conversion, as shown in block 408. The conversion can include controlling converters (e.g., rectifier(s)) to draw power from source connections and controlling converters (e.g., inverter(s)) to supply the power needed to meet the load demand determined in block 404, as indicated in block 410. In some embodiments, block 408 can also include drawing power from source connections to charge an ESS from the bus in block 410 or sending a signal to a generator to provide power to the system (e.g., to the DC bus system) that is distributed to the output panel 122 or to an ESS.

When sufficient power is not found in block 406, the process 400 can include modifying the available power, as shown in block 412. Such modification can include shedding, curtailing, or otherwise controlling demand of controllable loads or increasing available power by providing power from a generator or ESS. After modification of the available power, the process can proceed with commanding conversion to the bus in block 408 with an expectation that the conversion in block 408 would not cause problems for the panels, bus system, and other connected components.

FIG. 5 shows a high-level block diagram of a computer system 500 for embodiments of the present disclosure. In various embodiments, the computer system 500 can comprise various sets and subsets of the components shown in FIG. 5. Thus, FIG. 5 shows a variety of components that can be included in various combinations and subsets based on the operations and functions performed by the system 500 in different embodiments. For example, the computer system 500 can be used as at least part of the controller 300 of FIG. 3. It is noted that, when described or recited herein, the use of the articles such as "a" or "an" is not considered to be limiting to only one, but instead is intended to mean one or more unless otherwise specifically noted herein.

The computer system 500 can comprise a central processing unit (CPU) or processor 502 connected via an electronic communications bus 504 for electrical communication to a memory device 506, a power source 508, an electronic storage device 510, a network interface 512, an input device adapter 516, and an output device adapter 520. For example, one or more of these components can be connected to each other via a substrate (e.g., a printed circuit board or other substrate) supporting the bus 504 and other electrical connectors providing electrical communication between the components. The bus 504 can comprise a communication mechanism for communicating information between parts of the system 500. Thus, as used herein, a first component can be in "electrical communication" with a second component when the components are capable of one-way or bidirectional transfer of electrical signals between each other. In some cases, the electrical communication includes the transfer of relatively low-power control or monitoring signals (e.g., as in the components shown in FIGS. 3 and 5), and in some cases, the electrical communication includes the transfer of higher power line signals (e.g., as in the components shown in systems 100, 126, or 200.

The processor 502 can be a microprocessor or similar computing device configured to receive and execute a set of executable instructions 524 (e.g., a computer program) stored by the memory 506. The memory 506 can be referred to as main memory and can comprise components such as random access memory (RAM) or another dynamic electronic storage device for storing information and instructions to be executed by the processor 502. The memory 506 can also be used for storing temporary variables or other intermediate information during execution of instructions executed by the processor 502. The storage device 510 can comprise read-only memory (ROM) or another type of static storage device coupled to the bus 504 for storing static or long-term (i.e., non-dynamic) information and instructions for the processor 502. For example, the storage device 510 can comprise a magnetic or optical disk (e.g., hard disk drive (HDD)), solid state memory (e.g., a solid state disk (SSD)), or a comparable device. The storage device 510 can comprise a data repository 314 of information about electrical devices (e.g., meters, panels, grid connections, ESS, generators, loads, EVSE, etc.) at the customer site. The power source 508 can comprise a power supply capable of providing power to the processor 502 and other components connected to the bus 504, such as a connection to an electrical utility grid or a battery system. In some embodiments, the power source 508 comprises a connection to a service panel (e.g., 304) that is in electrical communication with a grid connection to power the system 500 via the grid.

The instructions 524 can comprise information for executing processes and methods using components of the system 500. Such processes and methods can include, for example, the methods described elsewhere herein, such as, for example, the processes described in connection with FIG. 4.

The network interface 512 can comprise an adapter for connecting the system 500 to an external device via a wired or wireless connection. For example, the network interface 512 can provide a connection to a computer network 526 such as a cellular network, the Internet, a local area network (LAN), a separate device capable of wireless communication with the network interface 512, network 312, other external devices or network locations, and combinations thereof. In one example embodiment, the network interface 512 is a wireless networking adapter configured to connect via WI-FI®, BLUETOOTH®, BLE, Bluetooth mesh, or a related wireless communications protocol to another device having interface capability using the same protocol. In some embodiments, a network device or set of network devices in the network 526 can be considered part of the system 500. In some cases, a network device can be considered connected to, but not a part of, the system 500.

The input device adapter 516 can be configured to provide the system 500 with connectivity to various input devices such as, for example, a keyboard 514, touchpad, or similar user input device, and a set of sensors 528 such as, for example, power meters (e.g., 302 or part of the rectifier(s) 306 or inverter(s) 308), related devices, and combinations thereof. Thus, the sensors 528 can be used to measure and monitor the usage and performance of the electronic devices operated at the customer site and particularly the devices connected to the bus system 120/200. The keyboard 514 or another input device (e.g., buttons or switches) can be used to provide user input such as input regarding the settings of the system 500 such as pricing information, timing preferences, manual limits on usage, EV charging scheduling information, and related information. In some embodiments, such input information can be obtained for the processor 502 via the network 526.

The output device adapter 520 can be configured to provide the system 500 with the ability to output information, such as by providing visual output using one or more displays 532 or indicators 534 or by providing audible output using one or more speakers 535. Other output devices can also be used, such as output devices that send control signals to controllable loads, EVSE, ESS, and generators that are part of the system. The processor 502 can be configured to control the output device adapter 520 to provide information to a user via the output devices connected to the adapter 520 and can be configured to control other devices via the output device adapter 520.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including:" and "having" come as used in the specification and claims shall have the same meaning as the term "comprising."

What is claimed is:

1. A method of managing electricity usage to charge electric vehicles, the method comprising:
    detecting a demand for an electric vehicle charging device connected to a utility customer site;
    determining a first power margin of a first power source connected to the utility customer site, wherein the first power source includes a first utility grid connection to an electrical utility grid;
    determining a second power margin for a second power source connected to the utility customer site, wherein the second power source includes a second utility grid connection to the electrical utility grid, wherein the first and second power sources have different power supply characteristics, and wherein the first and second utility grid connections separately connect to the electrical utility grid;
    drawing power from the first power source at a first power level within the first power margin and from the second power source at a second power level within the second power margin; and
    providing the drawn power to the electric vehicle charging device.

2. The method of claim 1, wherein the first power margin is based on an electrical service capacity of the first power source.

3. The method of claim 1, wherein the first power margin is based on time of use of the first power source.

4. The method of claim 1, wherein the first power margin is based on a previous peak consumption threshold for the first power source.

5. The method of claim 1, wherein drawing power from the first power source and from the second power source comprises supplying power to an electrical bus, and wherein providing the drawn power to the electric vehicle charging device comprises supplying power from the electrical bus to the electric vehicle charging device.

6. The method of claim 1, further comprising providing supplemental power to the electric vehicle charging device from an energy storage device.

7. A method of managing electricity usage to charge electric vehicles, the method comprising:
    detecting a demand for an electric vehicle charging device;
    determining a first power margin of a first power source connected to the electric vehicle charging device, wherein the first power source is controlled by a first utility customer of an electrical utility;
    determining a second power margin for a second power source connected to the electric vehicle charging device, wherein the first power source and the second power source have different power supply characteristics, and wherein the second power source is controlled by a second utility customer of the electrical utility;
    drawing power from the first power source at a first power level within the first power margin and from the second power source at a second power level within the second power margin; and
    providing the drawn power to the electric vehicle charging device.

8. The method of claim 7, wherein the first power source is connected to a first utility customer site, and wherein the second power source is connected to a second utility customer site.

9. The method of claim 7, wherein the first power source is a non-commercial grid connection or a non-industrial grid connection, and the second power source is a commercial grid connection or an industrial grid connection.

10. The method of claim 7, wherein power drawn from the first power source and power drawn from the second power source is aggregated into the drawn power provided to the electric vehicle charging device.

11. The method of claim 7, wherein the drawn power is provided to the electric vehicle charging device via a bus system.

12. The method of claim 7, further comprising providing supplemental power to the electric vehicle charging device from an energy storage device.

13. The method of claim 7, wherein the power supply characteristics of the first power source and the second power source comprise at least one of: a capability rating, a voltage, an alternating current (AC) signal type, a current rating, or a usage grade or permit.

14. A method of managing electricity usage to charge electric vehicles, the method comprising:
   detecting a demand for an electric vehicle charging device connected to a utility customer site;
   determining a first power margin of a first power source connected to the utility customer site, wherein the first power margin is based on a previous peak consumption threshold for the first power source;
   determining a second power margin for a second power source connected to the utility customer site, the first and second power sources having different power supply characteristics;
   drawing power from the first power source at a first power level within the first power margin and from the second power source at a second power level within the second power margin; and
   providing the drawn power to the electric vehicle charging device.

* * * * *